(12) United States Patent
Fukuda

(10) Patent No.: US 8,488,637 B2
(45) Date of Patent: Jul. 16, 2013

(54) SEMICONDUCTOR LASER

(75) Inventor: Chie Fukuda, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 13/046,898

(22) Filed: Mar. 14, 2011

(65) Prior Publication Data

US 2011/0235659 A1 Sep. 29, 2011

(30) Foreign Application Priority Data

Mar. 25, 2010 (JP) .................................. 2010-070536

(51) Int. Cl.
*H01S 3/10* (2006.01)

(52) U.S. Cl.
USPC ........ 372/20; 372/23; 372/50.11; 372/50.121

(58) Field of Classification Search
USPC .............................. 372/20, 23, 50.11, 50.121
See application file for complete search history.

(56) References Cited

U.S. PATENT DOCUMENTS

| | | | |
|---|---|---|---|
| 4,896,325 A | 1/1990 | Coldren | |
| 6,275,317 B1 * | 8/2001 | Doerr et al. | 398/201 |
| 7,424,041 B2 * | 9/2008 | Meliga et al. | 372/20 |
| 2003/0185256 A1 * | 10/2003 | Aoki | 372/20 |
| 2004/0136412 A1 * | 7/2004 | Jones | 372/20 |
| 2006/0274802 A1 * | 12/2006 | Aoki et al. | 372/45.01 |
| 2009/0092159 A1 * | 4/2009 | Kato | 372/20 |
| 2010/0142567 A1 * | 6/2010 | Ward et al. | 372/20 |

FOREIGN PATENT DOCUMENTS

| | | |
|---|---|---|
| JP | 2005-175021 | 6/2005 |
| JP | 2008-66318 | 3/2008 |

* cited by examiner

*Primary Examiner* — Yuanda Zhang
(74) *Attorney, Agent, or Firm* — Smith, Gambrell & Russell, LLP

(57) ABSTRACT

A semiconductor laser includes a light emission end facet; a first optical waveguide extending in a predetermined optical-axis direction, the first optical waveguide being optically coupled to the light emission end facet; a ring resonator having a plurality of periodic transmittance peak wavelengths, the ring resonator being optically coupled to the first optical waveguide; a plurality of gain waveguides that generate light by injection of current; an optical coupler portion that optically couples the first optical waveguide to each of the plurality of gain waveguides; and a plurality of second optical waveguides including diffraction gratings, the plurality of second optical waveguides being respectively optically coupled to the plurality of gain waveguides. Also, each of the diffraction gratings in the plurality of second optical waveguides has a different reflection band.

11 Claims, 11 Drawing Sheets

SEMICONDUCTOR LASER

BACKGROUND OF THE INVENTION

1. Field of the Invention

The present invention relates to a semiconductor laser.

2. Description of the Related Art

U.S. Pat. No. 4,896,325 discloses a wavelength tunable semiconductor laser. In the wavelength tunable semiconductor laser, a gain region and a phase adjustment region are provided between two mirrors that are arranged at both ends. With the semiconductor laser described in U.S. Pat. No. 4,896,325, current is individually injected into the two mirrors at both ends, and reflection spectra of the two mirrors are adjusted, so that an emission wavelength is tuned.

SUMMARY OF THE INVENTION

However, to obtain laser oscillation, the current injected to the mirrors has to be finely adjusted such that reflection peaks of the two mirrors are superposed on each other. In addition, the phase adjustment region is provided between the two mirrors to continuously tune the wavelength. Current injected into the phase adjustment region has also to be finely adjusted. Thus, it is hard and difficult to perform current control for the adjustment of the wavelength.

A semiconductor laser according to an aspect of the present invention includes a light emission end facet; a first optical waveguide extending in a predetermined optical-axis direction, the first optical waveguide being optically coupled to the light emission end facet; a ring resonator having a plurality of periodic transmittance peak wavelengths, the ring resonator being optically coupled to the first optical waveguide; a plurality of gain waveguides that generate light by injection of current; an optical coupler portion that optically couples the first optical waveguide to each of the plurality of gain waveguides; and a plurality of second optical waveguides including diffraction gratings, the plurality of second optical waveguides being respectively optically coupled to the plurality of gain waveguides. Also, each of the diffraction gratings in the plurality of second optical waveguides has a different reflection band.

When current is injected into one of the plurality of gain waveguides, light is generated in the selected gain waveguide. Light propagates through the selected gain waveguide and only light having a specific wavelength is selectively reflected by the diffraction grating in the second optical waveguide that is coupled to the selected gain waveguide. At this time, the wavelength or wavelength band of light that is reflected by a diffraction grating is determined by the period of the diffraction grating. The light propagates to the first optical waveguide that is coupled through the optical coupler portion. The ring resonator is optically coupled to the first optical waveguide. The ring resonator has a periodic wavelength-optical transmission characteristic and has a predetermined free spectral range (FSR). The wavelength width of a transmittance peak wavelength of the ring resonator can become smaller than a reflection band of the diffraction grating. Accordingly, the wavelengths of light that propagates through the optical waveguide can be further limited, and laser light having a single wavelength and a small spectrum width can be obtained.

Also, in the semiconductor laser, each of the diffraction gratings in the plurality of second optical waveguides has a different reflection band. Accordingly, by injecting current selectively to one of the gain waveguides and hence generating light, the emission wavelength can be desirably determined. In particular, with the semiconductor laser, the output wavelength can be easily controlled without fine adjustment of current for wavelength control, unlike the wavelength tunable laser described in U.S. Pat. No. 4,896,325.

Also in the semiconductor laser, the light emission end facet, at least selected one of the plurality of gain waveguides, and the second optical waveguide that is optically coupled to the selected gain waveguide constitute a laser cavity. The diffraction grating in the second waveguide functions as one reflection mirror of the laser cavity, and the light emission end facet functions as the other reflection mirror. By selecting the gain waveguide to which the current is injected, from the plurality of gain waveguides, the gain waveguide and the second optical waveguide provided with the diffraction grating can be easily changed. Then, laser cavity including the selected gain waveguide and the second optical waveguide coupled to the selected gain waveguide can be changed. Therefore, lasing wavelength may be easily changed.

Also, the semiconductor laser may further include a first mode converter region arranged between the optical coupler portion and the gain waveguides, the first mode converter region including an optical waveguide having a taper-shaped waveguide which width gradually changes in the predetermined optical-axis direction. With this semiconductor laser, an optical waveguide loss that is resulted from the difference of the propagation modes and the distribution of the optical intensities between the optical coupler portion and the gain waveguide can be reduced.

Also, the semiconductor laser may further include a first phase adjustment portion that controls an optical path length of the first optical waveguide. Alternatively, the semiconductor laser may further include a second phase adjustment portion that controls an optical path length between the optical coupler portion and each of the plurality of second waveguides. With any of these configurations, the cavity length of the semiconductor laser can be changed, and the emission wavelength (longitudinal mode) of the semiconductor laser can be desirably adjusted.

Also, the semiconductor laser may further include a second mode converter region arranged between the first phase adjustment portion and the ring resonator, the second mode converter region including an optical waveguide having a taper-shaped waveguide which width gradually changes in the predetermined optical-axis direction. With this semiconductor laser, the optical waveguide loss that is resulted from the difference of the propagation modes and the distribution of the optical intensities between the first phase adjustment portion and the ring resonator can be reduced.

Also, in the semiconductor laser, the plurality of second optical waveguides may extend in the predetermined optical-axis direction and may be arrayed in a direction intersecting with the predetermined optical-axis direction. Accordingly, the plurality of second optical waveguides and the diffraction gratings provided along the plurality of second optical waveguides can be easily formed.

Also, in the semiconductor laser, the plurality of transmittance peak wavelengths of the ring resonator are included in reflection wavelength bands of the diffraction gratings by one-to-one correspondence. Accordingly, the emission wavelength of light by the semiconductor laser can be reliably controlled.

Also, in the semiconductor laser, each of the diffraction gratings provided in the second optical waveguides may have a different reflection wavelength band. A wavelength interval of the center wavelengths of the reflection wavelength bands of the diffraction gratings may be equal to an interval of the plurality of transmission peak wavelengths of the ring resonator. Accordingly, the emission wavelength of light by the semiconductor laser can be reliably controlled.

Also, in the semiconductor laser, each of the diffraction gratings provided in the second optical waveguides may be a chirp diffraction grating, or alternatively, each of the diffraction gratings provided in the second optical waveguides may have a periodic structure with a constant period.

DESCRIPTION OF THE PREFERRED EMBODIMENTS

Semiconductor lasers according to embodiments of the present invention will be described in detail below with reference to the attached drawings. It is to be noted that like reference signs refer like elements when the description is given for the drawings, and redundant description is omitted.

First Embodiment

Figure 1:
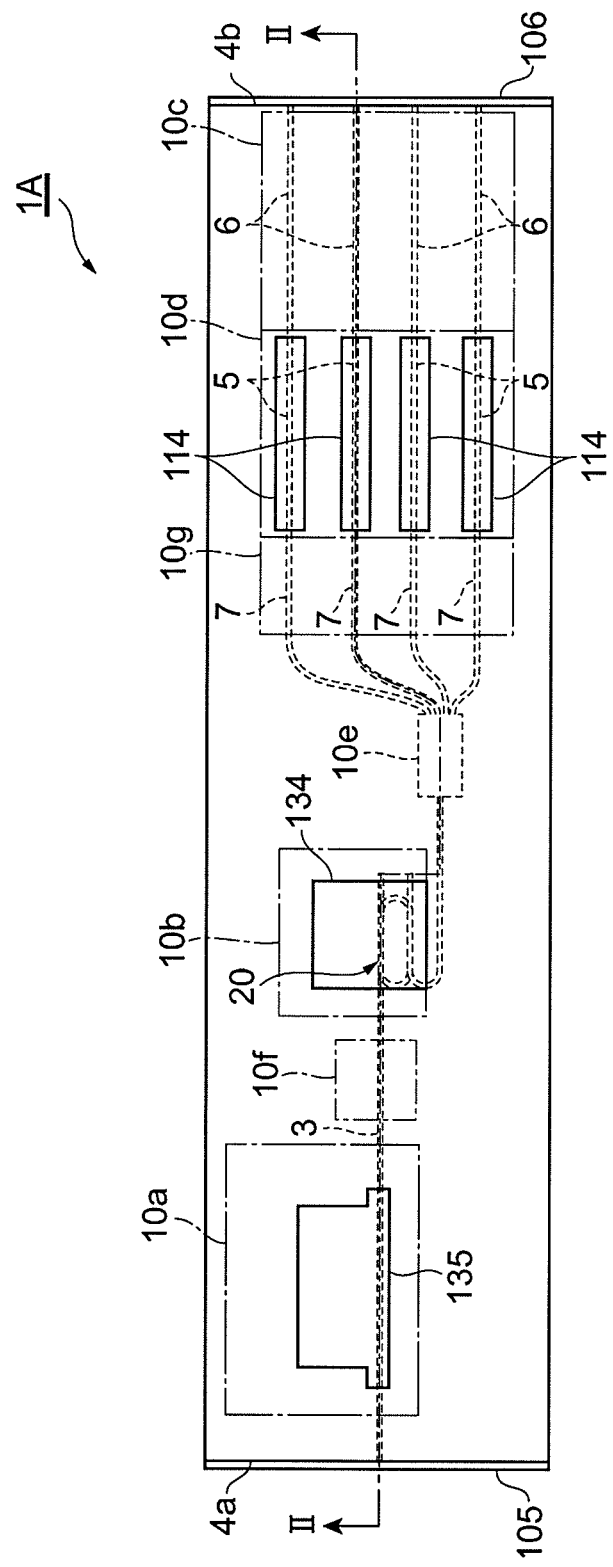
FIG. 1 is a plan view showing a configuration of a semiconductor laser that serves as a semiconductor laser according to a first embodiment of the present invention.
Figure 2:
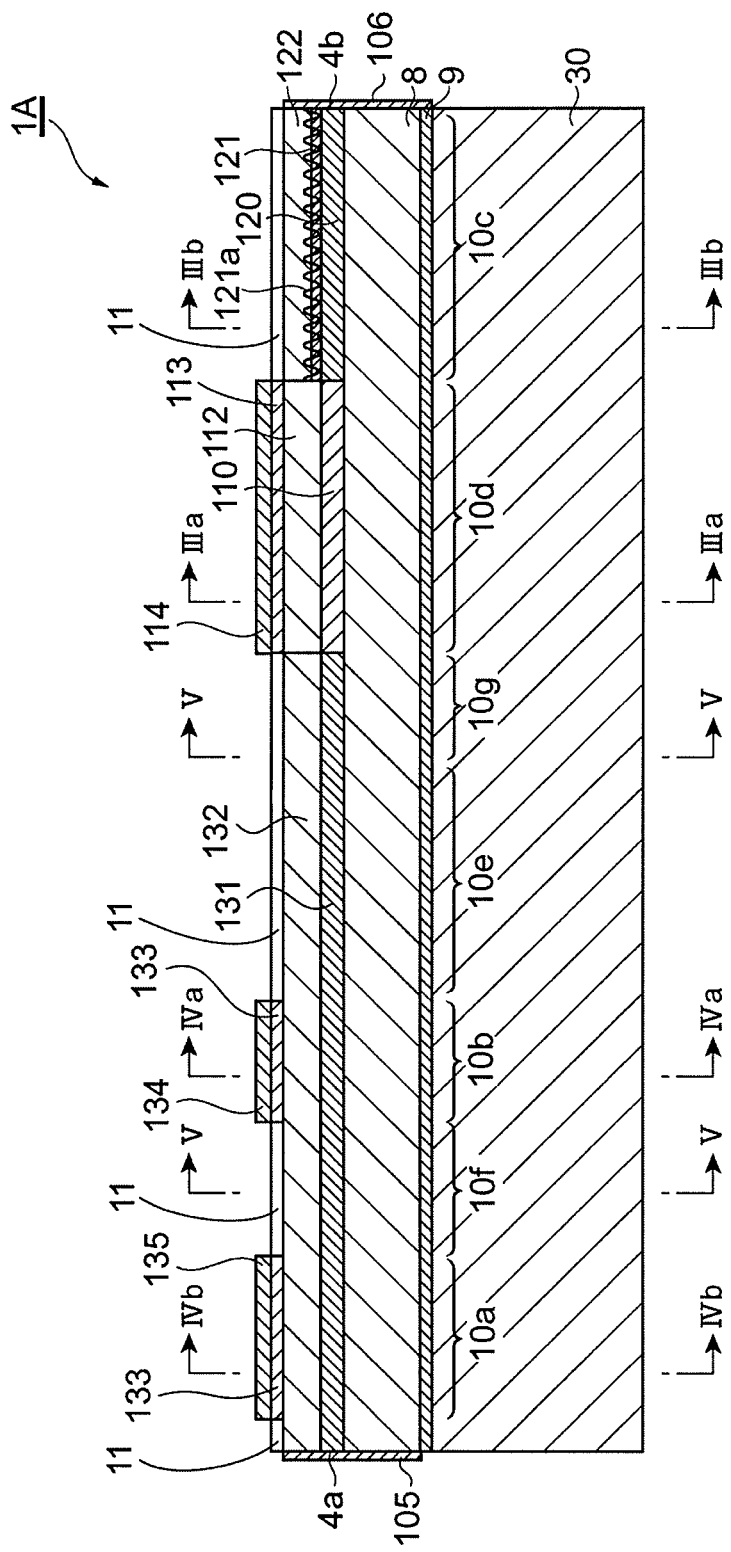
FIG. 2 is a cross-sectional view taken along line II-II of the semiconductor laser shown in FIG. 1.

FIG. 1 is a plan view of a semiconductor laser 1A according to a first embodiment of the present invention. FIG. 2 is a cross-sectional view taken along line II-II of the semiconductor laser 1A shown in FIG. 1. The semiconductor laser 1A is a wavelength tunable semiconductor laser.

Referring to FIGS. 1 and 2, the semiconductor laser 1A includes a light emission end facet 4a and an optical waveguide 3 (first optical waveguide) that is optically coupled to the light emission end facet 4a. In this embodiment, the light emission end facet 4a is provided with a high reflection (HR) film 105. The optical waveguide 3 extends from the light emission end facet 4a in a predetermined optical-axis direction (waveguide direction). The light emission end facet 4a may be a cleaved facet. A phase adjustment region (phase adjustment portion) 10a and a ring resonator region 10b are provided along the optical waveguide 3. A ring resonator 20 is formed in the ring resonator region 10b and the ring resonator 20 is optically coupled to the optical waveguide 3. The phase adjustment region 10a is a region for controlling the optical path length of the optical waveguide 3.

Also, the semiconductor laser 1A includes a number N of gain waveguides 5 (N is an integer equal to or larger than 2, in this embodiment, N=4) that generate light by injection of current, and the number N of optical waveguides 6 (second optical waveguides) that are respectively optically coupled to the gain waveguides 5. Diffraction gratings with different periods are formed respectively in the N optical waveguides 6. Accordingly, reflection wavelengths and reflection bands of these diffraction gratings are determined depending on the periods of the diffraction gratings, and hence the optical waveguides 6 have different reflection wavelengths and different reflection bands from each other.

The N optical waveguides 6 are formed in an optical reflector region 10c. The N gain waveguides 5 are formed in a gain region 10d that is provided next to the optical reflector region 10c. The N gain waveguides 5 extend along the predetermined optical-axis direction in the gain region 10d, and are arrayed in a direction intersecting with the predetermined optical-axis direction. Similarly, the N optical waveguides 6 extend along the predetermined optical-axis direction in the optical reflector region 10c, and are arrayed in the direction intersecting with the predetermined optical-axis direction.

The semiconductor laser 1A also includes an optical coupler portion 10e. The optical coupler portion 10e optically couples the optical waveguide 3 to each of the N gain waveguides 5. The optical coupler portion 10e may be, for example, a multimode interference (MMI) coupler, a Y-branched optical coupler, or a directional coupler.

The phase adjustment region 10a, the ring resonator region 10b, the optical reflector region 10c, the gain region 10d, and the optical coupler portion 10e are formed on a common semiconductor substrate 8 as shown in FIG. 2. The semiconductor substrate 8 is made of, for example, n-type indium phosphide (InP), and functions as a lower clad in the semiconductor laser 1A. The semiconductor substrate 8 is mounted on a cooling device 30 through a cathode electrode 9 provided on the back surface of the semiconductor substrate 8. The cooling device 30 maintains the temperature of the semiconductor substrate 8 and a layer structure on the principal surface of the semiconductor substrate 8 constant. The cooling device 30 may include, for example, a Peltier device.

Figure 3A:
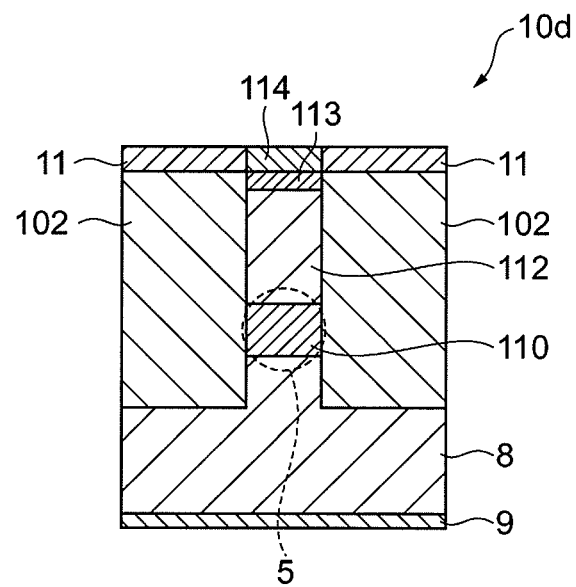
FIG. 3A is a cross-sectional view taken along line IIIa-IIIa of the semiconductor laser shown in FIG. 2, FIG. 3A representatively showing a gain waveguide included in a gain region.
Figure 3B:
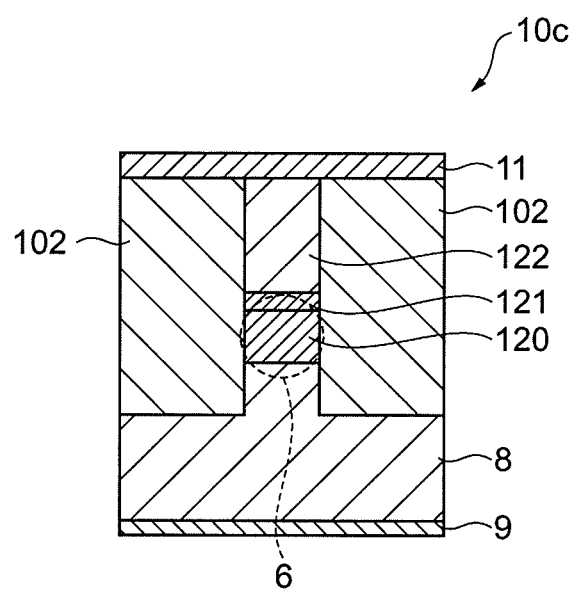
FIG. 3B is a cross-sectional view taken along line IIIb-IIIb of the semiconductor laser shown in FIG. 2, FIG. 3B representatively showing an optical waveguide included in an optical reflector region.

FIG. 3A is a cross-sectional view taken along line IIIa-IIIa of the semiconductor laser 1A shown in FIG. 2. FIG. 3A shows one of the plurality of gain waveguides 5 included in the gain region 10d. All the N gain waveguides 5 included in the gain region 10d have a cross-section structure similar to that shown in FIG. 3A. FIG. 3B is a cross-sectional view taken along line IIIb-IIIb of the semiconductor laser 1A shown in FIG. 2. FIG. 3B shows one of the plurality of optical waveguides 6 included in the optical reflector region 10c. All the N optical waveguides 6 included in the optical reflector region 10c have a cross-section structure similar to that shown in FIG. 3B. In FIGS. 3A and 3B, the illustration of the cooling device 30 (FIG. 2) is omitted.

Referring to FIGS. 2 and 3A, the gain region 10d includes an optical waveguide layer 110 provided on the semiconductor substrate 8, an upper cladding layer 112 provided on the optical waveguide layer 110, and a contact layer 113 provided on the upper cladding layer 112. The optical waveguide layer 110 constitutes the gain waveguide 5 shown in FIG. 1. The optical waveguide layer 110 is formed of a semiconductor having a larger band gap wavelength (i.e., having a smaller band gap energy) than a semiconductor of the semiconductor substrate 8. The optical waveguide layer 110 extends in an optical waveguide direction along the principal surface of the semiconductor substrate 8. The optical waveguide layer 110 includes, for example, a lower optical confinement layer provided on the semiconductor substrate 8, an active layer provided on the lower optical confinement layer, and an upper optical confinement layer provided on the active layer.

According to the embodiment, the lower and upper optical confinement layers are made of undoped gallium indium arsenide phosphide (GaInAsP), and the active layer has a multi quantum well (MQW) structure of GaInAsP. The active layer radiates light within a relatively wide wavelength band. The composition of the active layer is adjusted to generate light with a wavelength in a range from 1.52 to 1.57 µm. The optical waveguide layer 110 has a thickness of, for example, 0.3 µm, and a length in the optical waveguide direction of, for example, 300 µm.

The upper cladding layer 112 is made of p-type InP, and the contact layer 113 is made of p-type gallium indium arsenide (GaInAs). The upper cladding layer 112 and the contact layer 113 respectively have thicknesses of, for example, 2 µm and 0.2 µm.

The gain region 10d has a stripe-shaped mesa structure including the optical waveguide layer 110, the upper cladding layer 112, and the contact layer 113 on the semiconductor substrate 8 (see FIG. 3A). The stripe-shaped mesa structure extends in a predetermined optical waveguide direction. The stripe-shaped mesa structure has a width of, for example, 1.5 µm in a direction intersecting with the optical waveguide direction (i.e., the width here is a width in a direction orthogonal to the optical waveguide direction, the same can be said hereinafter). A semi-insulating region 102 is provided on both side surfaces of the stripe-shaped mesa structure and on the semiconductor substrate 8. The semi-insulating region 102 is made of a semi-insulating semiconductor. For example, the semi-insulating semiconductor may be iron (Fe)-doped InP.

An anode electrode 114 is provided on the contact layer 113 in the gain region 10d. The anode electrode 114 is an ohmic electrode made of, for example, titanium (Ti)/platinum (Pt)/gold (Au). Also, the cathode electrode 9 is provided on the back surface of the semiconductor substrate 8. The cathode electrode 9 is an ohmic electrode made of, for example, gold germanium (AuGe). Current is injected into the optical waveguide layer 110 through the anode electrode 114 and the cathode electrode 9. It is to be noted that the region on the upper surface of the gain region 10d not occupied by the anode electrode 114 is covered with an insulating film 11 that is made of, for example, silicon dioxide ($SiO_2$). The insulating film 11 has a thickness of, for example, 0.35

Referring to FIGS. 2 and 3B, the optical reflector region 10c is provided between an end facet 4b and the optical waveguide layer 110 in the gain region 10d. The end facet 4b is opposite to the light emission end facet 4a of the semiconductor laser 1A. The optical reflector region 10c includes an optical waveguide layer 120 provided on the semiconductor substrate 8, a diffraction grating layer 121 provided on the optical waveguide layer 120, and an upper cladding layer 122 provided on the diffraction grating layer 121. The optical waveguide layer 120 constitutes the optical waveguide 6 shown in FIG. 1. The optical waveguide layer 120 has a smaller band gap wavelength than a band gap wavelength of the active layer in the gain region 10d. For example, the band gap wavelength of the optical waveguide layer 120 is 1.3 µm or smaller. Also, the optical waveguide layer 120 is formed of a semiconductor having a larger band gap wavelength than a band gap wavelength of the semiconductor substrate 8. The optical waveguide layer 120 extends in the optical waveguide direction along the principal surface of the semiconductor substrate 8, and is coupled to the optical waveguide layer 110 in the gain region 10d.

Referring to FIGS. 1 and 2, an anti reflection (AR) film 106 is provided on an end facet of the optical reflector region 10c in the optical waveguide direction (i.e., end facet 4b). The AR film 106 has a reflectivity of, for example, 0.1% or lower. The optical waveguide layer 120 is coupled to the AR film 106.

The diffraction grating layer 121 is provided along the optical waveguide layer 120. In this embodiment, the diffraction grating layer 121 is provided directly above the optical waveguide layer 120. To effectively confine light around the optical waveguide layer 120, the band gap wavelength of the diffraction grating layer 121 is preferably smaller than the band gap wavelength of the optical waveguide layer 120. The diffraction grating layer 121 has band gap wavelength of, for example, 1.2 µm.

A diffraction grating 121a (see FIG. 2) having periodic projections and recesses is formed at the interface between the diffraction grating layer 121 and the upper cladding layer 122. The diffraction grating 121a is provided along the optical waveguide layer 120. The diffraction grating 121a is a chirp diffraction grating having a grating interval that changes in the optical waveguide direction of the optical waveguide layer 120.

According to the embodiment, the optical waveguide layer 120 and the diffraction grating layer 121 are made of undoped GaInAsP. The optical waveguide layer 120 and the diffraction grating layer 121 respectively have thicknesses of, for example, 0.3 µm and 50 nm. Also, the upper cladding layer 122 is made of p-type InP. The upper cladding layer 122 has a thickness of, for example, 2 µM. The optical waveguide layer 120 has a length in the optical waveguide direction of, for example, 500 µm.

The optical reflector region 10c has a stripe-shaped mesa structure including the optical waveguide layer 120, the diffraction grating layer 121, and the upper cladding layer 122 on the semiconductor substrate 8 (see FIG. 3B). Also, the stripe-shaped mesa structure of the optical reflector region 10c extends in the predetermined optical waveguide direction like the stripe-shaped mesa structure of the gain region 10d. The width of the stripe-shaped mesa structure in the direction intersecting with the optical waveguide direction is equivalent to that of the stripe-shaped mesa structure of the gain region 10d. Both side surfaces of the stripe-shaped mesa structure are buried by a semi-insulating region 102 that is commonly used for the gain region 10d.

Figure 4A:
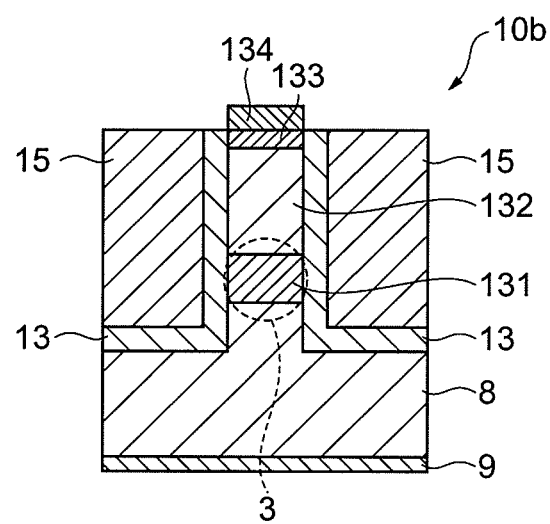
FIG. 4A is a cross-sectional view taken along line IVa-IVa of the semiconductor laser shown in FIG. 2, FIG. 4A showing a structure of a ring resonator region.

FIG. 4A is a cross-sectional view taken along line IVa-IVa of the semiconductor laser 1A shown in FIG. 2, FIG. 4A showing a structure of the ring resonator region 10b. In FIG. 4A, the illustration of the cooling device 30 (FIG. 2) is omitted.

The ring resonator region 10b includes the ring resonator 20. A wavelength-transmittance characteristic of the ring resonator 20 periodically changes and has discrete transmittance peak wavelengths. A wavelength interval of the periodic transmittance peak wavelengths of the ring resonator is called free spectral range (FSR). Referring to FIGS. 2 and 4A, the ring resonator region 10b includes an optical waveguide layer 131, an upper cladding layer 132, and a contact layer 133 that are laminated on the semiconductor substrate 8 in that order. The ring resonator region 10b also includes an anode electrode 134. The cathode electrode 9 provided on the back surface of the semiconductor substrate 8 is also used for a cathode electrode in the ring resonator region 10b.

The optical waveguide layer 131 is provided on the principal surface of the semiconductor substrate 8. The optical waveguide layer 131 functions as an optical waveguide in the ring resonator region 10b, and constitutes part of the optical waveguide 3 of the semiconductor laser 1A.

In the embodiment, the optical waveguide layer 131 is made of undoped GaInAsP, and has a thickness of, for example, 0.3 μm. The optical waveguide layer 131 has a smaller band gap wavelength than a band gap wavelength of the active layer in the gain region 10d. For example, the band gap wavelength of the optical waveguide layer 131 is 1.3 μm or smaller. The upper cladding layer 132 is made of p-type InP, and the contact layer 133 is made of p-type GaInAs. The upper cladding layer 132 and the contact layer 133 respectively have thicknesses of, for example, 2 μm and 0.2 μm.

The ring resonator region 10b has a mesa structure including the optical waveguide layer 131, the upper cladding layer 132, and the contact layer 133. The upper surface and both side surfaces of the mesa structure of the ring resonator region 10b are covered with an insulating film 13 made of, for example, SiO$_2$. An opening is formed in the insulating film 13 at the upper surface of the mesa structure of the ring resonator region 10b to form an ohmic contact between the contact layer 133 and the anode electrode 134. The insulating film 13 is also provided on the principal surface of the semiconductor substrate 8. The insulating film 13 has a thickness of for example, 0.35 μm.

Further, a resin layer 15 is provided on the insulating film 13 to extend along both side surfaces of the mesa structure. The resin layer 15 is made of, for example, benzocyclobutene (BCB) resin, and has a thickness, for example, in a range from 1 to 2 vim.

The anode electrode 134 is provided on the contact layer 133, and is an ohmic electrode made of, for example, gold zinc (AuZn). Current is injected into the optical waveguide layer 131 in the ring resonator region 10b through the anode electrode 134 and the cathode electrode 9.

The optical waveguide layer 131 has a refractive index that changes in accordance with the magnitude of current to be injected. Hence, the transmittance peak wavelength of the ring resonator 20 is shifted in accordance with the magnitude of current that flows between the cathode electrode 9 and the anode electrode 134 while the FSR is maintained.

Figure 4B:
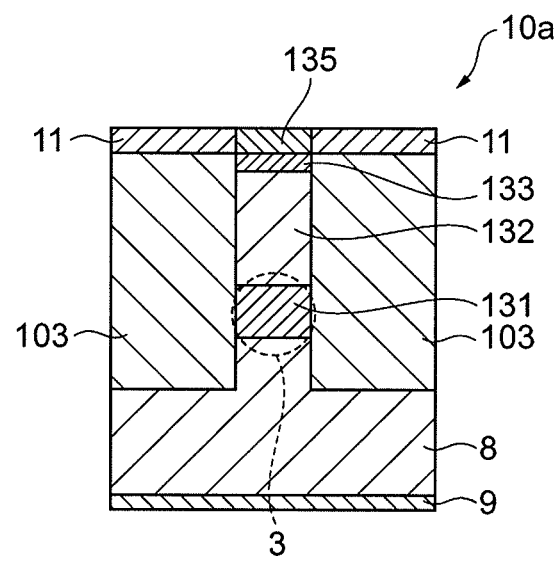
FIG. 4B is a cross-sectional view taken along line IVb-IVb of the semiconductor laser shown in FIG. 2, FIG. 4B showing a structure of a phase adjustment region.

FIG. 4B is a cross-sectional view taken along line IVb-IVb of the semiconductor laser 1A shown in FIG. 2, FIG. 4B showing a structure of the phase adjustment region 10a. In FIG. 4B, the illustration of the cooling device 30 (FIG. 2) is omitted.

The phase adjustment region 10a is a region for controlling the optical path length of the optical waveguide 3. The phase adjustment region 10a is provided between the ring resonator region 10b and the light emission end facet 4a. Referring to FIGS. 2 and 4B, the phase adjustment region 10a includes an optical waveguide layer 131, an upper cladding layer 132, and a contact layer 133 that are laminated on the semiconductor substrate 8 in that order. The optical waveguide layer 131, the upper cladding layer 132, and the contact layer 133 have configurations (materials and thicknesses) similar to those in the ring resonator region 10b. The phase adjustment region 10a also includes an anode electrode 135.

The cathode electrode 9 provided on the back surface of the semiconductor substrate 8 is also used for a cathode electrode in the phase adjustment region 10a.

The optical waveguide layer 131 in the phase adjustment region 10a constitutes part of the optical waveguide 3 of the semiconductor laser 1A. The optical waveguide layer 131 in the phase adjustment region 10a has a length in the optical waveguide direction of, for example, 100 μm. Referring to FIGS. 1 and 2, a high reflection (HR) film 105 is provided on an end facet of the phase adjustment region 10a in the optical waveguide direction (i.e., the light emission end facet 4a of the semiconductor laser 1A). The HR film 105 has a reflectivity of, for example, 90% or higher. The optical waveguide layer 131 in the phase adjustment region 10a is optically coupled to the HR film 105.

The phase adjustment region 10a has a stripe-shaped mesa structure including an optical waveguide layer 131, an upper cladding layer 132, and a contact layer 133 (see FIG. 4B). The stripe-shaped mesa structure of the phase adjustment region 10a extends in the predetermined optical waveguide direction. The stripe-shaped mesa structure has a width of, for example, 1.5 μm in the direction intersecting with the optical waveguide direction. A semi-insulating region 103 is provided on both side surfaces of the stripe-shaped mesa structure and on the semiconductor substrate 8. The semi-insulating region 103 is made of a semi-insulating semiconductor, for example, iron (Fe)-doped InP.

The anode electrode 135 is provided on the contact layer 133 in the phase adjustment region 10a, and is an ohmic electrode made of a material containing, for example, AuZn. Current is injected into the optical waveguide layer 131 in the phase adjustment region 10a through the anode electrode 135 and the cathode electrode 9.

The optical waveguide layer 131 in the phase adjustment region 10a has a refractive index that changes in accordance with the magnitude of current that is injected between the cathode electrode 9 and the anode electrode 135. When the refractive index of the optical waveguide layer 131 changes, the optical path length of the phase adjustment region 10a changes. As the result, the cavity length of the entire semiconductor laser 1A changes. Accordingly, by adjusting the injection amount of current to the optical waveguide layer 131 in the first phase adjustment region 10a, the emission wavelength (longitudinal mode) of the semiconductor laser 1A can be adjusted.

The semiconductor laser 1A of this embodiment further includes mode converter regions 10f and 10g in addition to the above-described configurations. The mode converter region 10f is provided at the optical waveguide 3 between the first phase adjustment region 10a and the ring resonator region 10b. As described above, in the first phase adjustment region 10a of this embodiment, the side surfaces of the stripe-shaped mesa structure including the optical waveguide layer 131 are buried by the semi-insulating region 103, which is the semi-insulating semiconductor such as Fe-doped InP. In contrast, in the ring resonator region 10b, the side surfaces of the stripe-shaped mesa structure including the optical waveguide layer 131 are buried by the resin layer 15, such as BCB. Therefore, the phase adjustment region 10a has a distribution form of optical intensities within a plane perpendicular to the optical waveguide direction, the distribution form which is different from that of the ring resonator region 10b. In other words, the propagation modes of light propagating in the first phase adjustment region 10a and the ring resonator region 10b are different. Therefore, scattering of light occurs at an interface between the first phase adjustment region 10a and the ring resonator region 10b. Then, an optical waveguide loss may be increased. The mode converter region 10f is provided to reduce an optical waveguide loss that is resulted from the difference of the propagation modes and the distribution of the optical intensities between the first phase adjustment region 10a and the ring resonator region 10b.

The mode converter region 10g is provided between the optical coupler portion 10e and the gain region 10d. The mode converter region 10g includes the number N of optical waveguides 7 (see FIG. 1) that couple the respective N gain waveguides 5 to the optical coupler portion 10e. The optical coupler portion 10e of this embodiment includes a cross-section structure similar to that of the ring resonator region 10b. However, the optical coupler portion 10e does not include an anode electrode. In the optical coupler portion 10e, side surfaces of a stripe-shaped mesa structure including an optical waveguide layer are buried by a resin layer, such as BCB. In contrast, in the gain region 10d, the side surfaces of the stripe-shaped mesa structure including the optical waveguide layer 110 are buried by the semi-insulating region 102, which is the semi-insulating semiconductor such as Fe-doped InP. Accordingly, the optical coupler portion 10e has a distribution form of optical intensities within a plane perpendicular to the optical waveguide direction, the distribution form which is different from that of the gain region 10d. Therefore, the propagation modes of light propagating in the optical coupler portion 10e and the gain region 10d are different. Therefore, scattering of light occurs at an interface between the optical coupler portion 10e and the gain region 10d. Then, an optical waveguide loss may be increased. The mode converter region 10g is provided to reduce an optical waveguide loss that is resulted from the difference of the propagation modes and the distribution of the optical intensities between the optical coupler portion 10e and the gain region 10d.

Figure 5:
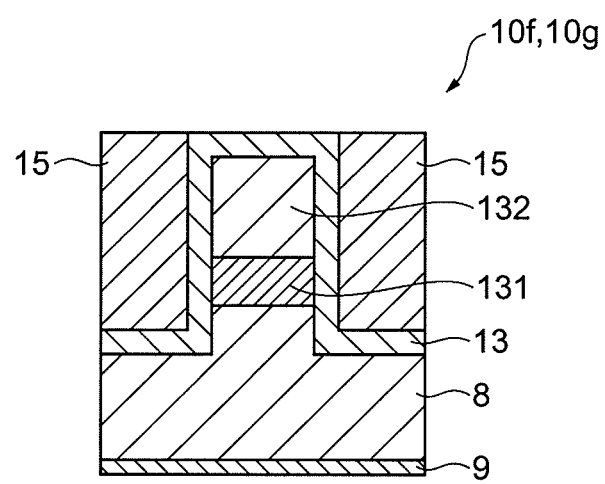
FIG. 5 is a cross-sectional view taken along line V-V of the semiconductor laser shown in FIG. 2, FIG. 5 showing a structure of a mode converter region.

FIG. 5 is a cross-sectional view taken along line V-V of the semiconductor laser 1A shown in FIG. 2, FIG. 5 showing a structure of the mode converter regions 10f and 10g. In FIG. 5, the illustration of the cooling device 30 (FIG. 2) is omitted. For the mode converter region 10g, one of the optical waveguides 7 included in the mode converter region 10g is representatively illustrated. All the N optical waveguides 7 included in the mode converter region 10g have a cross-section structure similar to that of the illustrated optical waveguide 7.

Referring to FIGS. 2 and 5, each of the mode converter regions 10f and 10g includes an optical waveguide layer 131 and an upper cladding layer 132 that are laminated on the semiconductor substrate 8 in that order. The optical waveguide layer 131 in the mode converter region 10f constitutes part of the optical waveguide 3, and the optical waveguide layer 131 in the mode converter region 10g constitutes the optical waveguide 7. The optical waveguide layer 131 and the upper cladding layer 132 have configurations (materials and thicknesses) similar to those in the ring resonator region 10b.

Each of the mode converter regions 10f and 10g has a mesa structure including the optical waveguide layer 131 and the upper cladding layer 132 (see FIG. 5). The upper surface and both side surfaces of the mesa structure are covered with an insulating film 13. The insulating film 13 is also provided on the principal surface of the semiconductor substrate 8. Further, a resin layer 15 is provided on the insulating film 13 to extend along both side surfaces of the mesa structure.

Figure 6:
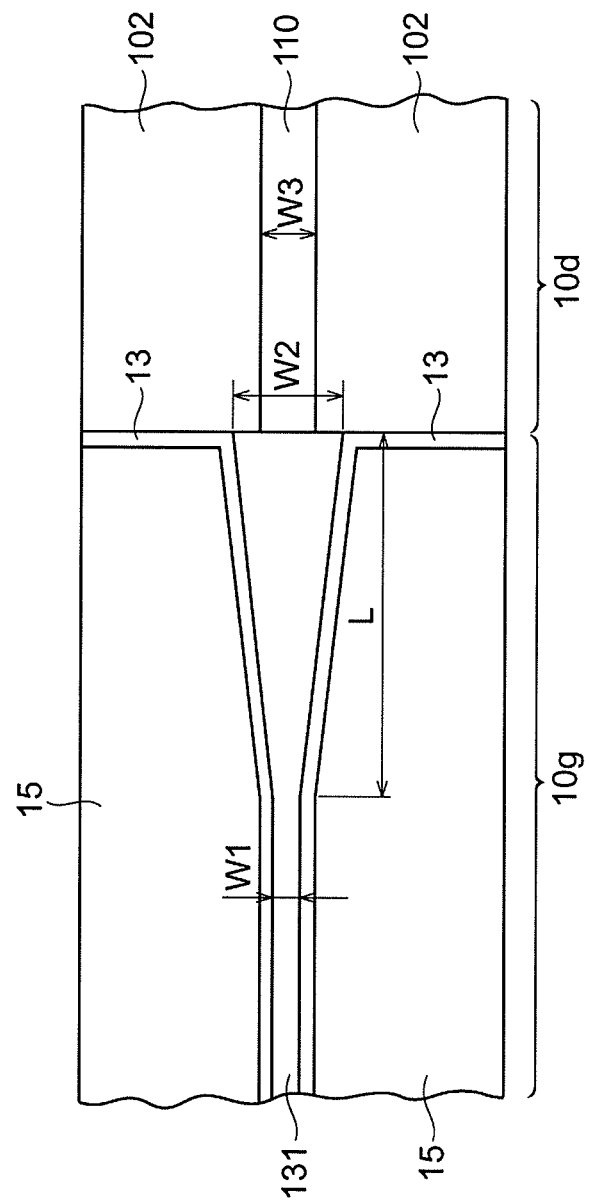
FIG. 6 illustrates a plan outline of an optical waveguide layer in the mode converter region.

FIG. 6 illustrates a plan outline of the optical waveguide layer 131 in the mode converter region 10g. It is to be noted that the optical waveguide layer 131 in the mode converter region 10f has a similar plan outline as that in FIG. 6. Referring to FIG. 6, the optical waveguide layer 131 in the mode converter region 10g is arranged next to the optical waveguide layer 110 in the gain region 10d. Also, the optical waveguide layer 131 in the mode converter region 10g includes a region with a constant optical waveguide width, and a region having a taper-shaped waveguide with a width gradually increasing toward the interface with respect to the optical waveguide layer 110 in the waveguide direction. Referring to FIG. 6, a width W1 that is the constant optical waveguide width is, for example, 1.4 µm. A width W2 of the optical waveguide layer 131 at the interface with respect to the optical waveguide layer 110 is, for example, 2.5 µm. A length L of the tapered portion of the optical waveguide layer 131 is, for example, 70 µm. A width W3 of the optical waveguide layer 110 in the gain region 10d is, for example, 1.8 µm.

The operation of the semiconductor laser 1A having the above-described configurations will be described. Current is supplied to a gain waveguide 5 (hereinafter, named as selected gain waveguide 5) of the N gain waveguides 5 (the optical waveguide layers 110) in the gain region 10d through the anode electrode 114. Light is generated in the selected gain waveguide 5, to which the current is supplied. The light is guided to the optical waveguide 6 that is coupled to the selected gain waveguide 5, and is reflected by the diffraction grating that is provided at the optical waveguide 6. Light with a predetermined wavelength that is determined by the period of the diffraction grating is selectively reflected. The light with the predetermined wavelength passes through the optical coupler portion 10e, reaches the optical waveguide 3, passes through the ring resonator region 10b and the first phase adjustment region 10a, and is reflected again by the light emission end facet 4a. The light is split by the optical coupler portion 10e evenly to the N gain waveguides 5. Then, only the light guided to the selected gain waveguide 5 is amplified. As the result, the diffraction grating that is provided at the optical waveguide 6 coupled to the selected gain waveguide 5, the selected gain waveguide 5 and the light emission end facet 4a constitute a laser cavity. Laser oscillation is obtained in the laser cavity including the selected gain waveguide 5. Laser light is emitted from the light emission end facet 4a, passes through the HR film 105, and is output to the outside of the semiconductor laser 1A.

Figure 7A:
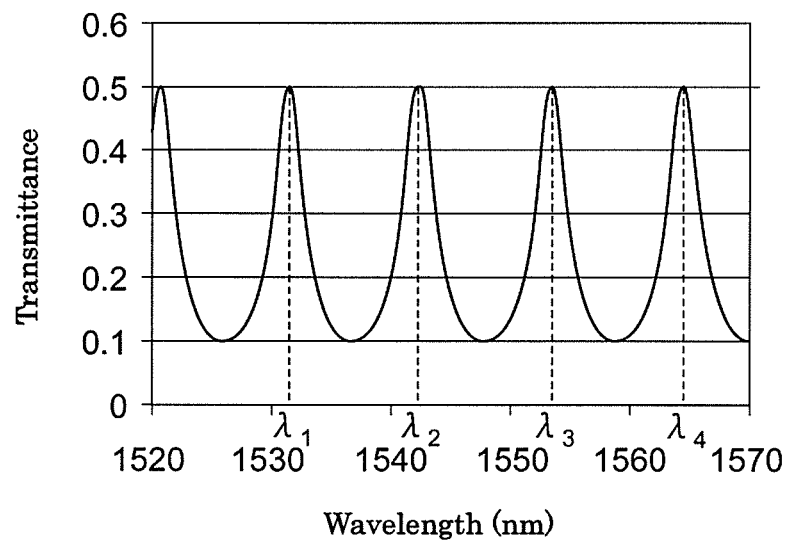
FIG. 7A is a graph showing an example of a transmission spectrum characteristic of a ring resonator provided in the ring resonator region.

FIG. 7A is a graph showing an example of a transmission spectrum of the ring resonator 20 provided in the ring resonator region 10b. In FIG. 7A, the vertical axis plots an optical transmittance and the horizontal axis plots a wavelength. Referring to FIG. 7A, the optical transmittance periodically changes with a predetermined FSR, and has discrete transmittance peak wavelengths $\lambda_1$ to $\lambda_4$. An FSR of a ring resonator is determined by an optical path length of a ring-like optical waveguide that forms the ring resonator. Hence, the FSR of the ring resonator can be changed by changing the optical path length. Regarding the ring resonator 20 having the transmission spectrum characteristic shown in FIG. 7A, an effective refractive index is 3.57 when current is not injected, a coupling length of a multimode interference (MMI) coupler that couples a ring-like waveguide to a straight waveguide is 15 μm, and a bend radius of the ring-like waveguide is 5 μm. In this case, the FSR is 11.1 nm.

Figure 7B:
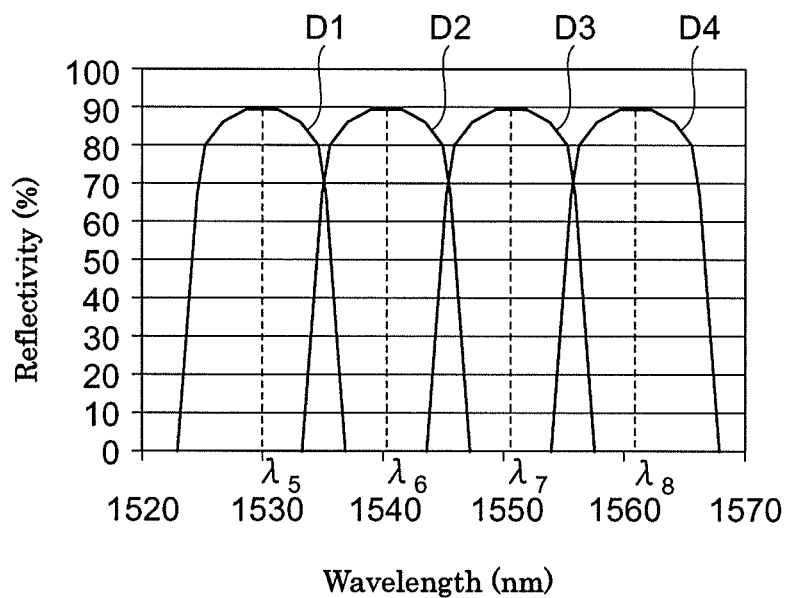
FIG. 7B illustrates wavelength-reflectivity characteristics of the optical reflector region, waveforms D1 to D4 respectively indicating reflection characteristics in reflection wavelength bands of diffraction gratings that are provided along a number N of optical waveguides.

FIG. 7B illustrates a wavelength-reflectivity characteristic of the optical reflector region 10c. Referring to FIG. 7B, waveforms D1 to D4 indicate reflection characteristics in reflection wavelength bands of the diffraction gratings 121a that are provided along the N optical waveguides 6. In this embodiment, center wavelengths $\lambda_5$ to $\lambda_8$ of the reflection wavelength bands of the diffraction gratings 121a, which are respectively provided at the N optical waveguides 6, are different from one another. To be more specific, the waveform D1 of the center wavelength $\lambda_5$ has reflectivities in a wavelength band from 1525 to 1535 nm, the waveform D2 of the center wavelength $\lambda_6$ has reflectivities in a wavelength band from 1535 to 1545 nm, the waveform D3 of the center wavelength $\lambda_7$ has reflectivities in a wavelength band from 1545 to 1555 nm, and the waveform D4 of the center wavelength $\lambda_8$ has reflectivities in a wavelength band from 1555 to 1565 nm.

In this embodiment, the periods of the diffraction gratings and the optical path length of the ring-like optical waveguide that form the ring resonator are determined such that the transmission peak wavelengths $\lambda_1$ to $\lambda_4$ of the ring resonator 20 are provided in the reflection wavelength bands of the diffraction gratings 121a, which are respectively provided at the N optical waveguides 6, by one-to-one correspondence. Also, in this embodiment, the wavelength interval of the center wavelengths $\lambda_5$ to $\lambda_8$ of the reflection wavelength bands of the diffraction gratings 121a, which are respectively provided at the N optical waveguides 6, are equivalent to the wavelength interval (i.e., FSR) of the transmittance peak wavelengths $\lambda_1$ to $\lambda_4$ of the ring resonator 20.

Light that propagates through the optical waveguide in the semiconductor laser 1A has a wavelength in the transmittance peak wavelengths $\lambda_1$ to $\lambda_4$ of the transmission spectrum shown in FIG. 7A. Also, light that propagates through the optical waveguide in the semiconductor laser 1A has a wavelength in the waveforms D1 to D4 in FIG. 7B, i.e., has a wavelength in the reflection wavelength band corresponding to the optical waveguide 6 that is coupled to the selected gain waveguide 5. Accordingly, when current is supplied to the gain waveguide 5, which is coupled to the optical waveguide 6 having the reflection characteristic of, for example, the waveform D1, the semiconductor laser 1A outputs laser light with the wavelength of $\lambda_1$.

In the semiconductor laser 1A, current is injected into one of the N gain waveguides 5 as described above. As the result, light is generated selectively at the gain waveguide 5 to which the current is supplied. The light is reflected by the diffraction grating 121a formed at the optical waveguide 6 coupled to the gain waveguide 5. At this time, the wavelength of light that is reflected by a diffraction grating is determined by the period of the diffraction grating 121a. The light reflected by the diffraction grating of the optical waveguide 6 is guided to the optical waveguide 3 through the optical coupler portion 10e. Also, the ring resonator 20 included in the optical waveguide 3 has a periodic transmittance peak wavelength. The band width of the single transmission peak of the ring resonator 20 can become narrower than the reflection band width of the diffraction grating 121a. Thus, light that propagates through the laser cavity of the semiconductor laser 1A has a single wavelength with a narrow spectrum width.

In the semiconductor laser 1A, the diffraction gratings 121a which are provided respectively along the N optical waveguides 6, have the different center wavelengths $\lambda_5$ to $\lambda_8$ in the reflection wavelength bands. Accordingly, by injecting current selectively to one of the N gain waveguides 5 and hence generating light, the emission wavelength can be desirably determined. In particular, with the semiconductor laser 1A, the output wavelength can be easily tuned without fine adjustment of current for wavelength control, unlike the wavelength tunable laser described in U.S. Pat. No. 4,896,325.

Like this embodiment, the semiconductor laser 1A preferably includes the first phase adjustment region 10a for controlling the optical path length of the optical waveguide 3. Accordingly, the length of the laser cavity of the semiconductor laser 1A can be changed. As the result, the emission wavelength (longitudinal mode) of the semiconductor laser 1A can be desirably adjusted.

Like this embodiment, in the semiconductor laser 1A, the N optical waveguides 6 preferably extend in the predetermined direction and are arrayed in the direction intersecting with the predetermined direction. Accordingly, the N optical waveguides 6 and the diffraction gratings 121a, which are respectively provided along the optical waveguides 6, can be easily formed.

Like this embodiment, the transmittance peak wavelengths $\lambda_1$ to $\lambda_4$ of the ring resonator 20 are preferably included in the reflection waveform bands of the diffraction gratings 121a, which are respectively provided at the N optical waveguides 6, by one-to-one correspondence. Also, the wavelength interval of the center wavelengths $\lambda_5$ to $\lambda_8$ of the reflection wavelength bands of the diffraction gratins 121a, which are respectively provided at the N optical waveguides 6, is preferably equal to the FSR of the ring resonator 20. With this configuration, the wavelength and spectrum width of the light that propagates through the laser cavity of the semiconductor laser 1A can be reliably controlled. That is, with the semiconductor laser 1A, laser light of a single mode with a markedly small spectrum width can be obtained.

Next, an example of a method for fabricating the semiconductor laser 1A will be described. First, a semiconductor layer, which becomes the optical waveguide layers 120 and 131, and a semiconductor layer, which becomes the diffraction grating layer 121 are grown on the semiconductor substrate 8 made of n-type InP by a epitaxial growth method such as a metal-organic chemical vapor deposition (MOCVD) method. Then, a diffraction grating pattern is formed on a resist by electron beam lithography. Then, the diffraction grating layer 121 is etched by dry etching by using the resist as an etching mask, so that the diffraction grating 121a is formed on the surface of the diffraction grating layer 121. The resist is removed, and then a p-type InP layer is grown on the diffraction grating 121a by, for example, the MOCVD method. Then, the diffraction grating 121a is embedded in the p-type InP layer. Then, the upper cladding layers 122 and 132 are formed.

Then, the semiconductor layers grown on a region, which becomes the gain region 10d are removed by dry etching. Then, the optical waveguide layers 110, which include the lower optical confinement layer, the active layer having the multi quantum well (MQW) structure, and the upper optical confinement layer; and the upper cladding layers 112 are grown on the removed regions of the semiconductor substrate by butt-joint method.

Then, a semiconductor layer, which becomes the contact layers 113 and 133, is grown by, for example, the MOCVD method. Then, portions of the contact layers between regions on which the anode electrodes are formed are removed so that the anode electrodes are electrically isolated.

Then, the regions corresponding to the ring resonator region 10b, the optical coupler portion 10e, the mode converter regions 10f and 10g are covered with a mask. Simultaneously, the regions corresponding to the phase adjustment region 10a, the optical reflector region 10c, and gain region 10d are covered with the mask such that only the portion corresponding to the optical waveguide 3, the gain waveguides 5, and the optical waveguide 6 are remained. The semiconductor layers in the regions corresponding to the phase adjustment region 10a, the optical reflector region 10c are etched to a depth to reach the semiconductor substrate 8 by dry etching using the mask. In this etching process, the portions corresponding to the optical waveguide 3, the gain waveguides 5, and the optical waveguide 6 are remained. Thus, the stripe-shaped mesa structure is formed. Then, both side surfaces of the mesa structure are buried by the semi-insulating regions 102 and 103, and the mask is removed.

Then, the regions corresponding to the phase adjustment region 10a, the optical reflector region 10c, and gain region 10d are covered with a mask. Simultaneously, the regions corresponding to the ring resonator region 10b, the optical coupler portion 10e, the mode converter regions 10f and 10g are covered with a mask while the portions corresponding to the optical waveguides 3 and 7 are remained. The semiconductor layers in the regions corresponding to the ring resonator region 10b, the optical coupler portion 10e, the mode converter regions 10f and 10g are etched to a depth to reach the semiconductor substrate 8 by dry etching using the mask. In this etching process, the portions corresponding to the optical waveguides 3 and 7 are remained. Thus, the mesa structure is formed. Then, the insulating film composed of, for example, $SiO_2$ is deposited on both side surfaces of the mesa structure by a chemical vapor deposition (CVD) method. Thus, the insulating film 13 is formed. Then, the BCB resin is formed on the insulating film 13 by spin-coating method, and the BCB resin is hardened. Thus, the resin layer 15 is formed, and then the mask is removed.

Then, the portions of the insulating films 13 and the resin layer 15 where the anode electrodes are arranged are removed. Then, the insulating film 11 composed of, for example, $SiO_2$ or $SiN$ is deposited on the entire surfaces of the phase adjustment region 10a, the ring resonator region 10b, the optical reflector region 10c, the gain region 10d, the optical coupler portion 10e, and the mode converter regions 10f and 10g by the CVD method. Etching is performed for the portions of the insulating film 11 where the anode electrodes are arranged until the contact layer is exposed. The openings are formed. Then, the anode electrodes 114, 134, and 135 are formed on the contact layer at the openings by liftoff process. At this time, wiring and electrode pads are also formed. In addition, the thickness of the semiconductor substrate 8 is reduced to about 100 μm, for example, by polishing the back surface of the semiconductor substrate 8. Then, the cathode electrode 9 is evaporated on the back surface of the semiconductor substrate 8.

Finally, the semiconductor substrate 8 is cleaved in a bar-like shape, and hence a chip bar is formed. One cleaved facet of the chip bar is coated with the HR film 105, and the other facet is coated with the AR film 106. Then, a plurality of laser chips included in the chip bar are divided into individual laser chips. The divided laser chip is mounted on the cooling device 30. Accordingly, the semiconductor laser 1A is completed.

Second Embodiment

Figure 8:
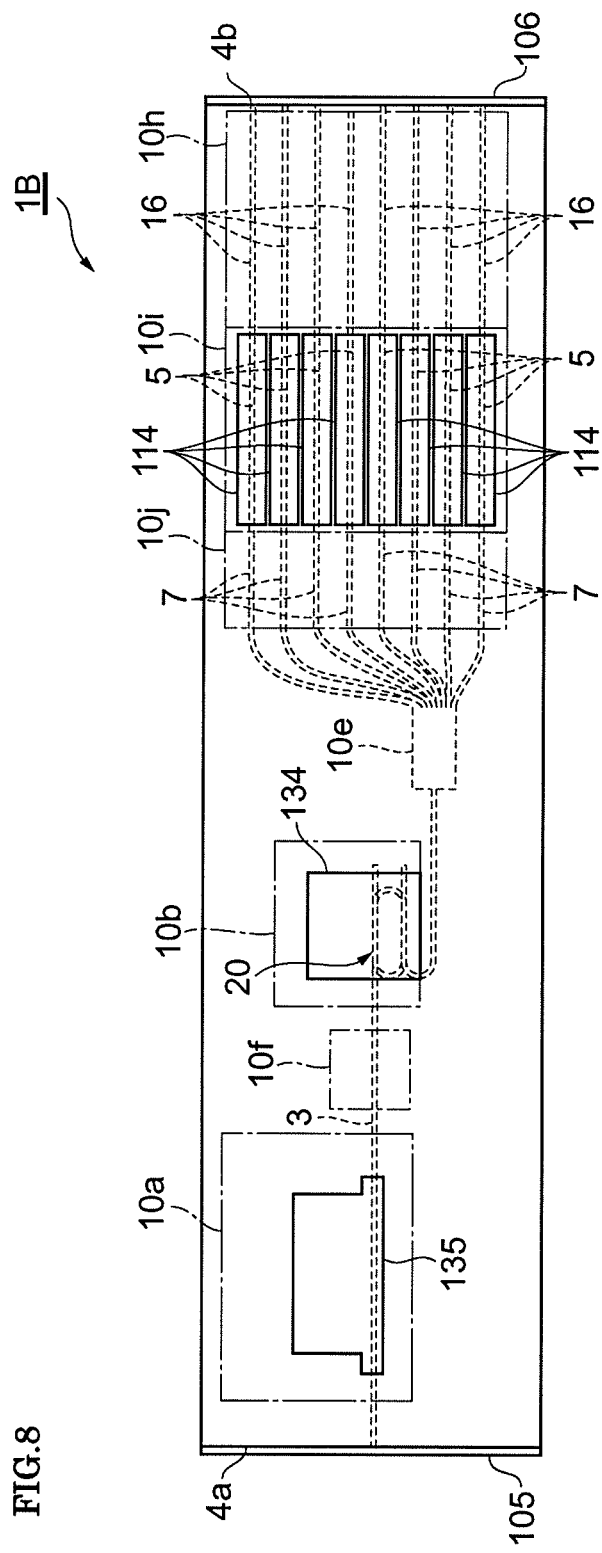
FIG. 8 is a plan view showing a configuration of a semiconductor laser that serves as a semiconductor laser according to a second embodiment of the present invention.

FIG. 8 is a plan view of a semiconductor laser 1B according to a second embodiment of the present invention. The semiconductor laser 1B is a wavelength tunable semiconductor laser.

The semiconductor laser 1B of this embodiment differs from the semiconductor laser 1A of the first embodiment in the configuration of the optical reflector region. More specifically, in this embodiment, an optical reflector region 10h includes eight optical waveguides 16 (second optical waveguides). The eight optical waveguides 16 are respectively provided with diffraction gratings. Each of the diffraction gratings, which are respectively provided at the optical waveguides 16, has a periodic structure with a constant period. That is, the diffraction grating is not a chirp diffraction grating, unlike the first embodiment. The diffraction gratings respectively provided at the optical waveguides 16 are different from one another. Accordingly, center wavelengths of reflection wavelength bands of the diffraction gratings are different from one another. In each of the optical waveguides 16, light with a predetermined wavelength is reflected by a diffraction grating. The wavelength of light reflected by the diffraction grating is determined by the period of the diffraction grating. The optical reflector region 10h has a similar cross-section structure to the structure of the optical reflector region 10c of the first embodiment except that the number of optical waveguides is different and the diffraction gratings have the different periodic structures.

Also, the semiconductor laser 1B of this embodiment includes a gain region 10i and a mode converter region 10j instead of the gain region 10d and the mode converter region 10g of the first embodiment. The gain region 10i includes eight gain waveguides 5 to correspond to the optical reflector region 10h. Similarly, the mode converter region 10j includes eight optical waveguides 7 to correspond to the optical reflector region 10h. The structure of the gain waveguides 5 and the structure of the optical waveguides 7 are similar to those of the first embodiment.

The eight gain waveguides 5 extend along a predetermined direction in the gain region 10i, and are arrayed in a direction intersecting with the predetermined direction. Similarly, the eight optical waveguides 16 extend along the predetermined direction in the optical reflector region 10h, and are arrayed in the direction intersecting with the predetermined direction.

The semiconductor laser 1B of this embodiment includes a first phase adjustment region (phase adjustment portion) 10a, a ring resonator region 10b, an optical coupler portion 10e, a mode converter region 10f, a HR film 105, and an AR film 106. The configurations of these components are similar to those of the first embodiment except for the FSR of a ring resonator 20 included in the ring resonator region 10b.

Figure 9A:
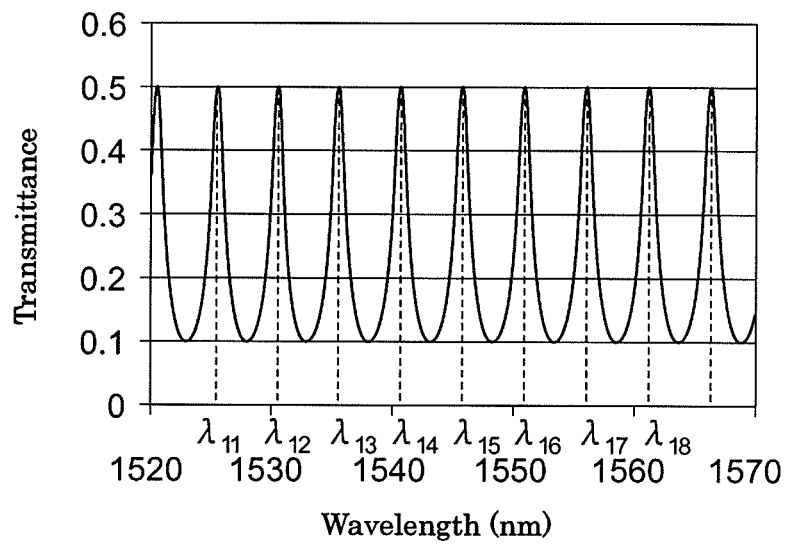
FIG. 9A is a graph showing an example of a transmission spectrum characteristic of a ring resonator according to the second embodiment.

FIG. 9A is a graph showing an example of a transmission spectrum of the ring resonator 20 of this embodiment. In FIG. 9A, the vertical axis plots an optical transmittance and the horizontal axis plots a wavelength. Referring to FIG. 9A, transmittance changes periodically. However, the transmission spectrum of the ring resonator 20 of this embodiment has a smaller FSR than the FSR of the first embodiment. Also, the ring resonator 20 includes discrete transmittance peak wavelengths $\lambda_{11}$ to $\lambda_{18}$. Regarding the ring resonator 20 having the transmission spectrum characteristic shown in FIG. 9A, an effective refractive index is 3.57 when current is not injected, a coupling length of a multimode interference (MAC) coupler that couples a ring-like waveguide to a straight waveguide is 34 μm, and a bend radius of the ring-like waveguide is 10 μM. In this case, the FSR is 5.2 nm.

Figure 9B:
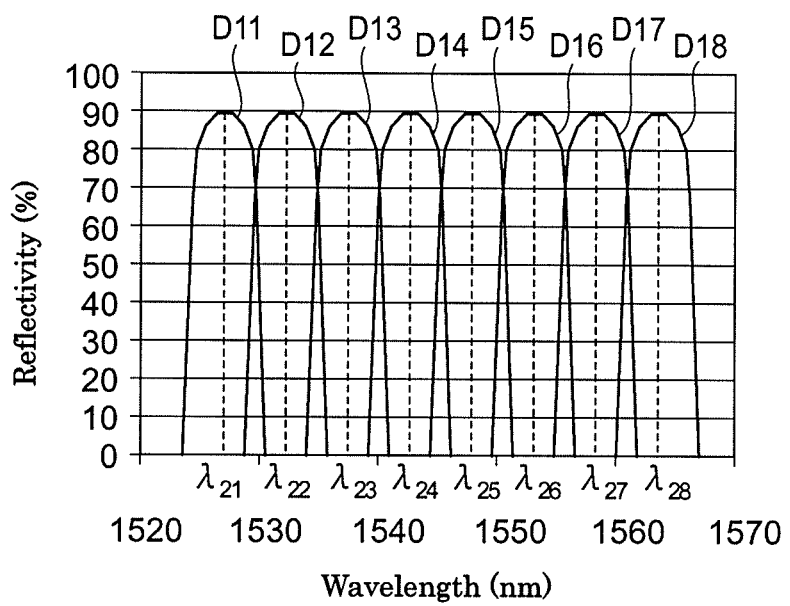
FIG. 9B illustrates wavelength-reflectivity characteristics of an optical reflector region according to the second embodiment, waveforms D11 to D18 respectively indicating reflection characteristics in reflection wavelength bands of diffraction gratings that are provided along eight optical waveguides.

FIG. 9B illustrates a wavelength-reflectivity characteristic of the optical reflector region 10h of this embodiment. Waveforms D11 to D18 indicate reflection characteristics of the diffraction gratings, which are respectively provided along the eight optical waveguides 16. In this embodiment, center wavelengths $\lambda_{21}$ to $\lambda_{28}$ of the reflection wavelength bands of the diffraction gratings, which are respectively provided at the eight optical waveguides 16, are different from one another. Further, since the diffraction gratings have the constant periods, the reflection wavelength band widths are smaller than those of the first embodiment. Thus, the interval of the center wavelengths $\lambda_{21}$ to $\lambda_{28}$ is smaller than that of the first embodiment.

To be more specific, the waveform D11 of the center wavelength $\lambda_{21}$ has reflectivities in a wavelength band from 1525 to 1530 nm, and the waveform D12 of the center wavelength $\lambda_{22}$ has reflectivities in a wavelength band from 1530 to 1535 nm. Similarly, reflectivities are shifted by about 5 nm each to the waveform D18 of the center waveform $\lambda_{28}$.

Also in this embodiment, the transmission peak wavelengths $\lambda_{21}$ to $\lambda_{28}$ are included in the reflection waveform bands of the diffraction gratings, which are respectively provided at the eight optical waveguides 16, by one-to-one correspondence, by adjusting the periods of the diffraction gratings, the optical path length of the ring resonator 20, etc. Also, the wavelength interval of the center wavelengths $\lambda_{21}$ to $\lambda_{28}$ of the reflection wavelength bands of the diffraction gratings, which are respectively provided at the eight optical waveguides 16, is equivalent to the wavelength interval (i.e., FSR) of the transmittance peak wavelengths $\lambda_{21}$ to $\lambda_{28}$ of the ring resonator 20.

Light that propagates through the optical waveguide in the semiconductor laser 1B has a wavelength in the transmittance peak wavelengths $\lambda_{21}$ to $\lambda_{28}$ of the transmission spectrum shown in FIG. 9A. Also, light that propagates through the optical waveguide in the semiconductor laser 1B has a wavelength in the waveforms D11 to D18 in FIG. 9B, i.e., has a wavelength within the reflection wavelength band corresponding to the optical waveguide 16 that is coupled to the selected gain waveguide 5. Accordingly, when current is supplied to the gain waveguide 5, which is coupled to the optical waveguide 16 having the reflection characteristic of, for example, the waveform D11, from among the eight gain waveguides 5, the semiconductor laser 1B outputs laser light with the wavelength of $\lambda_{11}$.

With the semiconductor laser 1B of this embodiment, the emission wavelength can be desirably determined by injecting current selectively into one of the eight gain waveguides 5 and hence generating light, like the semiconductor laser 1A of the first embodiment. In particular, with the semiconductor laser 1B, the output wavelength can be easily controlled without fine adjustment of current for wavelength control.

In this embodiment, the semiconductor laser 1B includes the first phase adjustment region 10a. However, the phase adjustment region may be omitted.

Third Embodiment

Figure 10:
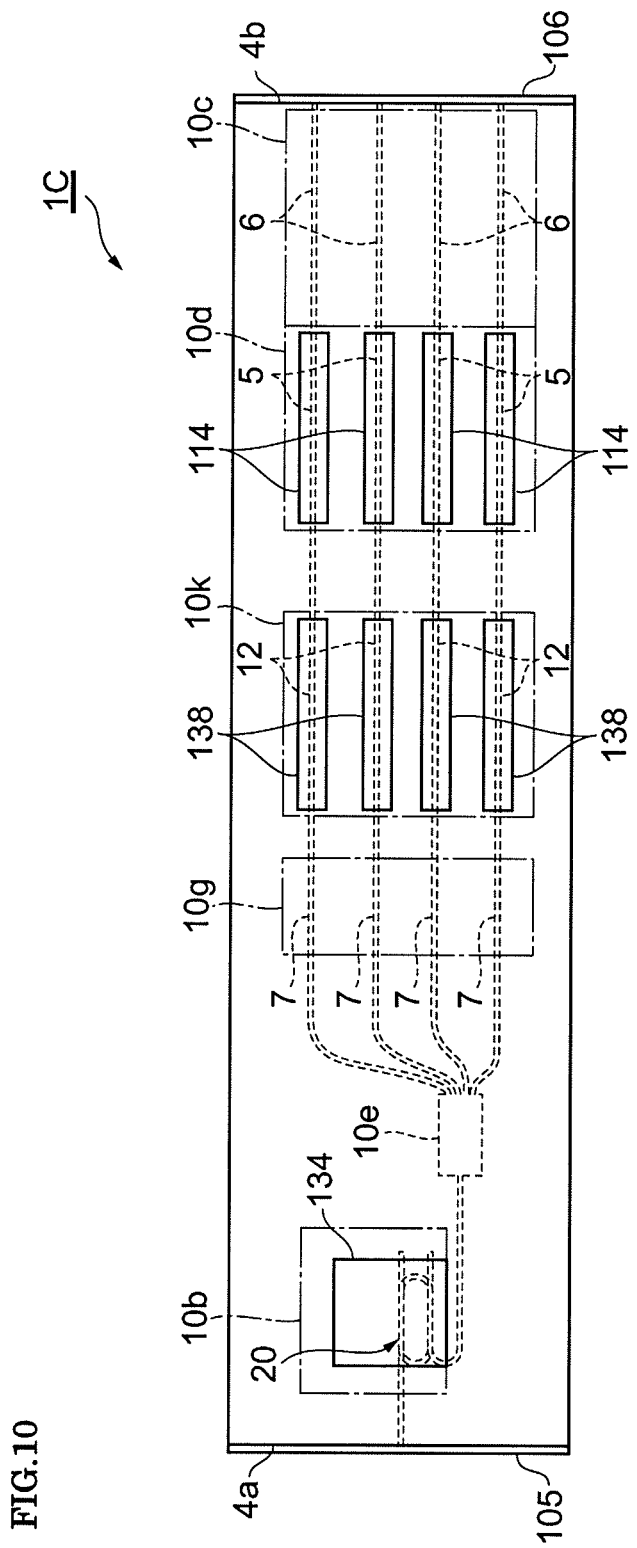
FIG. 10 is a plan view showing a configuration of a semiconductor laser that serves as a semiconductor laser according to a third embodiment of the present invention.

FIG. 10 is a plan view of a semiconductor laser 1C according to a third embodiment of the present invention. The semiconductor laser 1C is a wavelength tunable semiconductor laser.

The semiconductor laser 1C of this embodiment differs from the semiconductor laser 1A of the first embodiment in the arrangement of the phase adjustment region. In particular, the semiconductor laser 1C of this embodiment includes a second phase adjustment region (phase adjustment portion) 10k instead of the first phase adjustment region 10a of the first embodiment. Referring to FIG. 10, the second phase adjustment region 10k is arranged between a gain region 10d and a mode converter region 10g, and includes a number N (in this embodiment, four) of optical waveguides 12. The N optical waveguides 12 couple a number N of gain waveguides 5 in the gain region 10d respectively to a number N of optical waveguides 7 in the mode converter region 10g. The second phase adjustment region 10k controls optical path lengths between an optical coupler portion 10e and the respective N optical waveguides 6 in the optical reflector region 10c by changing refractive indices of the N optical waveguides 12.

Figure 11:
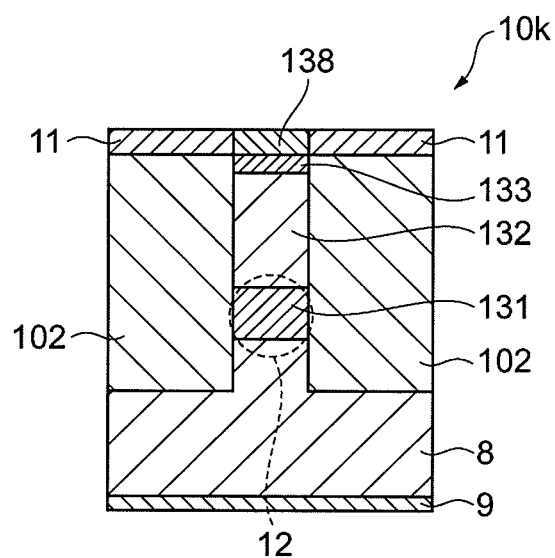
FIG. 11 illustrates a cross-section structure of a phase adjustment region according to the third embodiment, FIG. 11 representatively showing an optical waveguide included in a phase adjustment region.

FIG. 11 illustrates a cross-section structure of the second phase adjustment region 10k of this embodiment, FIG. 11 representatively showing an optical waveguide 12 included in the second phase adjustment region 10k. All the N optical waveguides 12 included in the second phase adjustment region 10k have a cross-section structure similar to that shown in FIG. 11.

Referring to FIG. 11, the second phase adjustment region 10k includes an optical waveguide layer 131, an upper cladding layer 132, and a contact layer 133 that are laminated on the semiconductor substrate 8 in that order. The optical waveguide layer 131, the upper cladding layer 132, and the contact layer 133 have configurations (materials and thicknesses) similar to those in the first phase adjustment region 10a of the first embodiment. Further, the second phase adjustment region 10k includes an anode electrode 138. The cathode electrode 9 provided on the back surface of the semiconductor substrate 8 is also used for a cathode electrode in the second phase adjustment region 10k.

The optical waveguide layer 131 in the second phase adjustment region 10k constitutes the optical waveguide 12 shown in FIG. 10. The optical waveguide layer 131 in the second phase adjustment region 10k is integrally formed with the optical waveguide layer 131 (see FIG. 5) in the adjacent mode converter region 10g. An end portion of the optical waveguide layer 131 is optically coupled to the optical waveguide layer 110 in the gain region 10d.

The second phase adjustment region 10k has a stripe-shaped mesa structure including the optical waveguide layer 131, the upper cladding layer 132, and the contact layer 133. The stripe-shaped mesa structure extends in a predetermined optical waveguide direction. The stripe-shaped mesa structure has a width of, for example, 1.5 µm in a direction intersecting with the optical waveguide direction. A semi-insulating region 102 is provided on both side surfaces of the stripe-shaped mesa structure and on the semiconductor substrate 8.

An anode electrode 138 is provided on the contact layer 133 of the second phase adjustment region 10k, and is an ohmic electrode made of, for example, AuZn. Current is injected into the optical waveguide layer 131 in the second phase adjustment region 10k through the anode electrode 138 and the cathode electrode 9.

The optical waveguide layer 131 in the second phase adjustment region 10k has a refractive index that changes in accordance with the magnitude of current that is injected through the cathode electrode 9 and the anode electrode 138. With this change in refractive index of the optical waveguide layer 131, the optical path length of the optical waveguide 12 in the second phase adjustment region 10k is changed. As the result, the cavity length of the semiconductor laser 1C is changed. Accordingly, by adjusting the injection amount of current to the optical waveguide layer 131 in the second phase adjustment region 10k, the emission wavelength (longitudinal mode) of the semiconductor laser 1C can be adjusted.

With the semiconductor laser 1C of this embodiment, the emission wavelength can be desirably determined by injecting current selectively into one of the N gain waveguides 5 and hence generating light, like the semiconductor laser 1A of the first embodiment. In particular, with the semiconductor laser 1C, the output wavelength can be easily controlled without fine adjustment of current for wavelength control.

The semiconductor laser according to the present invention is not limited to the above described embodiments, and may be modified in various ways. For example, in the above embodiments, the semiconductor substrate and the respective semiconductor layers use the InP-based compound semiconductor. However, the configuration of the present invention can be preferably realized even with the other group III-V semiconductor such as a GaAs-based compound semiconductor. Also, in the above embodiments, the configuration of the optical waveguide uses the stripe-shaped mesa structure. However, the optical waveguide may use the other configuration such as ridge type. Even with such an optical waveguide, the advantages of the present invention can be desirably attained.

The principle of the present invention has been illustrated and described according to the preferable embodiment. However, the persons skilled in the art should recognize that the details of the embodiment can be modified without departing from the principle. Therefore, we claim the benefits obtained by all corrections and modifications made within the scope of the claims and the scope of the spirit of the present invention.

What is claimed is:

1. A semiconductor laser, comprising:
a light emission end facet;
a first optical waveguide extending in a predetermined optical-axis direction, the first optical waveguide being optically coupled to the light emission end facet;
a ring resonator having a plurality of periodic transmittance peak wavelengths, the ring resonator being optically coupled to the first optical waveguide;
a plurality of gain waveguides that generate light by injection of current;
an optical coupler portion that optically couples the first optical waveguide to each of the plurality of gain waveguides; and
a plurality of second optical waveguides respectively optically coupled to the plurality of gain waveguides, each second optical waveguide of the plurality of second optical waveguides including a diffraction grating having a reflection wavelength band, wherein
the reflection wavelength bands of the diffraction gratings are different from each other, and
each reflection wavelength band includes a single transmittance peak wavelength of the ring resonator.

2. The semiconductor laser according to claim 1, wherein the light emission end facet, at least a selected one of the plurality of gain waveguides, and the second optical waveguide that is optically coupled to the selected gain waveguide constitute a laser cavity.

3. The semiconductor laser according to claim 1, further comprising a mode converter region arranged between the optical coupler portion and the gain waveguides, the mode converter region including an optical waveguide having a taper-shaped waveguide having a width that gradually changes in the predetermined optical-axis direction,
wherein the taper-shaped waveguide in the mode converter region has a width at an interface between the mode converter region and the gain waveguides that is different from widths of the gain waveguides.

4. The semiconductor laser according to claim 1, further comprising a phase adjustment portion that controls an optical path length of the first optical waveguide, the phase adjustment portion being provided at the first optical waveguide.

5. The semiconductor laser according to claim 4, further comprising a mode converter region arranged between the phase adjustment portion provided at the first optical waveguide and the ring resonator, the mode converter region including an optical waveguide having a taper-shaped waveguide having a width that gradually changes in the predetermined optical-axis direction,
wherein the taper-shaped waveguide in the mode converter region has a width at an interface between the mode converter region and the first optical waveguide in the phase adjustment portion that is different from a width of the first optical waveguide in the phase adjustment portion.

6. The semiconductor laser according to claim 1, further comprising a phase adjustment portion that controls an optical path length of an optical waveguide optically coupled to the optical coupler portion and each of the plurality of second optical waveguides, the phase adjustment portion being provided between the optical coupler portion and each of the plurality of second optical waveguides.

7. The semiconductor laser according to claim 1, wherein the plurality of second optical waveguides extend in the predetermined optical-axis direction and are arrayed in a direction intersecting with the predetermined optical-axis direction.

8. The semiconductor laser according to claim 1, wherein
the reflection wavelength bands of the diffraction gratings have center wavelengths that are separated from each other with a wavelength interval, and
the wavelength interval between the center wavelengths of the reflection wavelength bands is equal to an interval of the plurality of transmission peak wavelengths of the ring resonator.

9. The semiconductor laser according to claim 1, wherein each of the diffraction gratings provided in the second optical waveguides is a chirp diffraction grating.

10. The semiconductor laser according to claim 1, wherein each of the diffraction gratings provided in the second optical waveguides has a periodic structure with a constant period.

11. The semiconductor laser according to claim 1, wherein
the laser is formed of plural layers including an upper insulating layer,
regions of the plural layers in which the ring resonator and the gain waveguides are located have openings through the upper insulating layer and electrodes formed in the openings and on surfaces of the regions having the ring resonator and the gain waveguides respectively, and
the upper insulating layer is unopened above a region in which the second optical waveguides are located whereby the second optical waveguides have no corresponding electrode.

* * * * *